United States Patent [19]
Anderson

[11] Patent Number: 5,159,264
[45] Date of Patent: Oct. 27, 1992

[54] PNEUMATIC ENERGY FLUXMETER

[75] Inventor: Richard L. Anderson, Oak Ridge, Tenn.

[73] Assignee: Sematech, Inc., Austin, Tex.

[21] Appl. No.: 771,071

[22] Filed: Oct. 2, 1991

Related U.S. Application Data

[62] Division of Ser. No. 590,198, Sept. 28, 1990, abandoned.

[51] Int. Cl.$^5$ .......................................... H01L 21/306
[52] U.S. Cl. .............................. 324/158 R; 324/95; 156/626
[58] Field of Search ............... 324/158 F, 95, 104, 324/106, 158 R; 156/626; 374/32, 33; 250/349, 526

[56] References Cited

U.S. PATENT DOCUMENTS

| | | | |
|---|---|---|---|
| 2,398,606 | 4/1946 | Wang | 324/95 |
| 3,511,727 | 5/1970 | Hays | 156/626 |
| 4,115,184 | 9/1978 | Poulsen | 156/626 |
| 4,223,264 | 9/1980 | Yamamura et al. | 324/95 |
| 4,263,088 | 4/1981 | Gorin | 156/626 |
| 4,598,247 | 7/1986 | Mako et al. | 324/95 |
| 4,615,755 | 10/1986 | Tracy et al. | 156/626 |
| 4,910,409 | 3/1990 | Hoffman et al. | 374/32 |

FOREIGN PATENT DOCUMENTS

| | | | |
|---|---|---|---|
| 0260692 | 5/1970 | U.S.S.R. | 324/95 |
| 0286289 | 11/1970 | U.S.S.R. | 374/33 |
| 1166260 | 8/1967 | United Kingdom | 324/95 |

OTHER PUBLICATIONS

"The Electron Art", by Rockett, Electronics, Sep. 1948, p. 124.
Patent Abstracts of Japan, vol. 8, No. 141 (P-283) (1578) Jun. 30, 1984 & JP, A,59 040 219 (Matsushita) Mar. 5, 1984.
World Patent Index Latest Section ch, Wk 8142, Derwent Pub Ltd, London, GB; Class C, AN 81-77364D & Su, A,798 282 (Azerb Petro) Jan. 23, 1981.
Instruments and Experimental Techniques, vol. 31, No. 2, Mar. 1988, New York, US, pp. 410–412; Kulik et al: 'Method for Measurement of thermal-flux Distribution in Low-Temperature Plasma'.
Journal of Physics D. Applied Physics. vol. 11, No. 3, Feb. 1978, Letchworth GB Erents et al: 'A Novel Technique for Measurement of Energetic Hydrogen Flux to the Walls in Fusion Devices'.

Primary Examiner—Ernest F. Karlsen
Assistant Examiner—William J. Burns
Attorney, Agent, or Firm—William W. Kidd

[57] ABSTRACT

A fluxmeter pneumatically measures the amount of plasma energy impinging onto a semiconductor wafer. The fluxmeter is comprised of two hollow bulbs filled with gas. One bulb has one end exposed to the plasma while the opposite base end is supported by a substantially constant temperature wafer chuck. The other bulb has one end exposed to a heater and the opposite base end supported by the chuck. The two bulbs are coupled to a differential pressure sensor, which output is coupled to a servo for controlling the current to the heater. When plasma energy is applied, gas pressure in the first bulb changes and is sensed by the pressure sensor. The servo then adjusts the heater current until the gas pressure in the second bulb equals that of the first bulb. Upon reaching equilibrium the heater current is measured to determine the plasma energy flux impinging on the wafer.

10 Claims, 3 Drawing Sheets $$a_{wall} = \pi (r_o^2 - r_i^2)$$

PNEUMATIC ENERGY FLUXMETER

This application is a division of Ser. No. 590,198, filed Sept. 28, 1990, now abandoned.

BACKGROUND OF THE INVENTION

1. Field of the Invention

The present invention relates to the field of semiconductor manufacturing devices and, more particularly, to a measuring device for use in a plasma reactor.

2. Prior Art

In the manufacture of semiconductor integrated circuit devices, various circuit elements are formed in or on a base substrate, such as a silicon substrate. Various processes for forming these integrated circuit devices are well known in the prior art. In performing some of these steps, a semiconductor wafer is placed in a reactor chamber in order for the wafer to undergo certain necessary processing steps, which may include steps for depositing or etching various layers of the wafer. When these wafers are loaded into a given chamber, the wafer is placed on a wafer chuck, which is a type of semiconductor platen. These platens, or chucks are used to control the wafer temperature during a given process cycle. In most of these processes it is desirable that the energy input into the wafer is known in order to control the various process parameters.

In order to control the amount of energy coupled to the wafer, various prior art schemes have been devised to measure the energy flux in the reactor chamber. These prior art techniques include, for example, directly monitoring an electrical circuit parameter, such as an RF bias voltage; and indirect methods such as the use of temperature measuring probes within the chamber. Although a number of prior art monitoring schemes are available, these methods may not necessarily provide accurate assessment of the amount of energy coupled to the wafer itself. This is notably so in processing systems where plasma is utilized in the reactor chamber for processing the wafer.

In many prior art plasma systems, indirect methods are utilized to measure the energy flux to the wafer. Typically, in these instances, a circuit parameter, such as the RF bias voltage, is monitored to calculate (or extrapolate) the energy flux based on the specifications provided for the given reactor. Direct measurements can provide more accurate and continuous results, but are difficult to obtain. For example, direct measurements by the use of probes within the chamber are not desirable, because such probes are intrusive and tend to interfere with the plasma field. That is, the intrusive probe may interact with the plasma field, thereby altering the flux field and/or density of the plasma field. Additionally, isolation of such probes is difficult to achieve and noise induced can contribute to erroneous readings.

Furthermore, although some of these prior art energy monitoring techniques may provide an accurate measurement of energy flux in the reactor chamber, such measurements may not reflect the actual flux to the wafer. In practice, it is desirable to know the actual value of the energy flux to the wafer and not necessarily the energy flux in the reactor chamber as a whole.

Accordingly, it is appreciated that what is needed is an energy monitoring technique in which the energy coupled to the wafer is measured accurately, but without interfering with the plasma field in the reactor chamber.

SUMMARY OF THE INVENTION

A pneumatic energy fluxmeter for measuring the energy flux flow into a semiconductor wafer is described. The fluxmeter is substantially a hollow bulb wherein it is filled with an inert gas. One end of the fluxmeter is exposed for the purpose of having the energy flux impinge thereon, while the opposite end of the fluxmeter has an opening coupled to a tubing, which is also filled with the inert gas.

The fluxmeter is disposed into an opening of a wafer chuck and adjacent to a semiconductor wafer in order to measure the energy flux impinging on the wafer. Prior to the activation of the plasma, the two ends of the fluxmeter are approximately at the same temperature and the pressure of gas in the fluxmeter is at a stabilized predetermined pressure.

When the plasma energy is activated, the energy flux impinging on the exposed end of the fluxmeter causes a difference in temperature across the fluxmeter. This change in the temperature increases the pressure of the gas in the confined volume. The change in the pressure of the gas is sensed by a pressure measuring device which is coupled to the external end of the tubing to the fluxmeter. The fluxmeter, therefore, provides a pneumatic means for measuring the amount of energy flux impinging on the exposed surface of the fluxmeter, which energy flux is substantially equivalent to that which also impinges on the semiconductor wafer.

In the alternative embodiment, two gas bulbs are utilized in an opposing fashion wherein the first pneumatic bulb is exposed to receive the energy flux, while the second pneumatic bulb is sheltered from the energy flux. However, the exposed end of the second bulb is connected to an electrical heater. The gas tubing from the two bulbs are coupled differentially to a differential pressure sensor which then is coupled to a servo. As gas pressure in the first bulb changes due to the coupling of energy flux to its exposed surface, a pressure difference is created between the gas of the two bulbs and this difference then sensed by the differential pressure sensor. The differential pressure sensor provides appropriate signals to a servo which then provides a feedback signal to increase/decrease the current supply to the heater element coupled to the second bulb. The heater current is compensated to maintain a value which provides the second bulb with the same gas pressure as the first bulb. Upon stabilization the gas in both bulbs will be at the same gas pressure. By measuring the current to the heater with the second bulb, an amount of energy flux impinging on the first bulb can be determined.

By utilizing a pneumatic apparatus for measuring the amount of energy flux, the present invention provides for a non-electrical means for the measurement of energy flux.

DETAILED DESCRIPTION OF THE PREFERRED EMBODIMENT

A pneumatic energy fluxmeter for measuring the energy flow into a semiconductor wafer on a wafer chuck is described. In the following description, numerous specific details are set forth, such as specific shapes, materials, etc., in order to provide a thorough understanding of the present invention. However, it will be obvious to one skilled in the art that the present invention may be practiced without these specific details. In other instances, well-known processes and structures have not been described in detail in order not to unnecessarily obscure the present invention.

Figure 1:
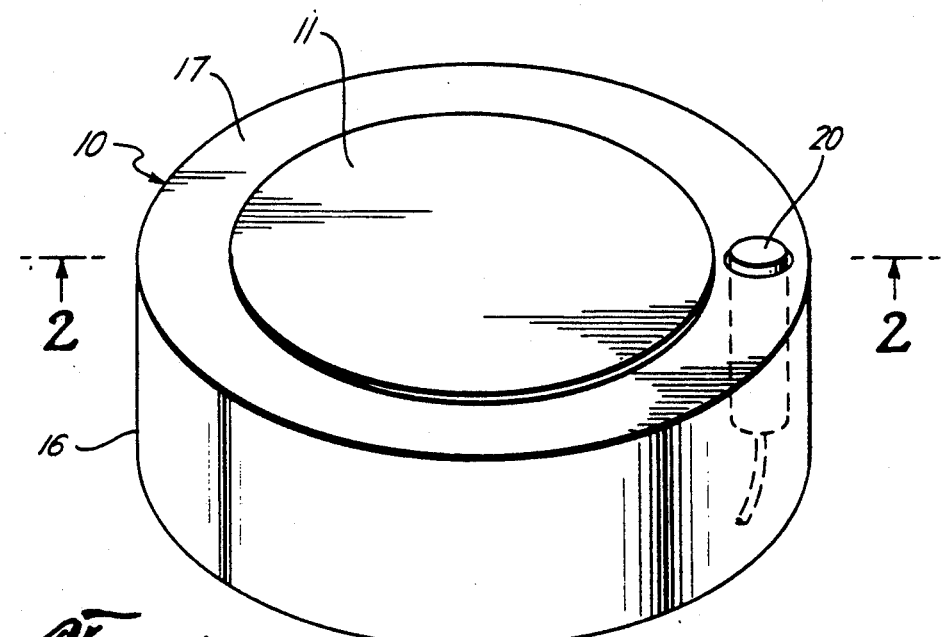
FIG. 1 is a pictorial view of a fluxmeter of the present invention residing in a prior art wafer chuck.
Figure 2:
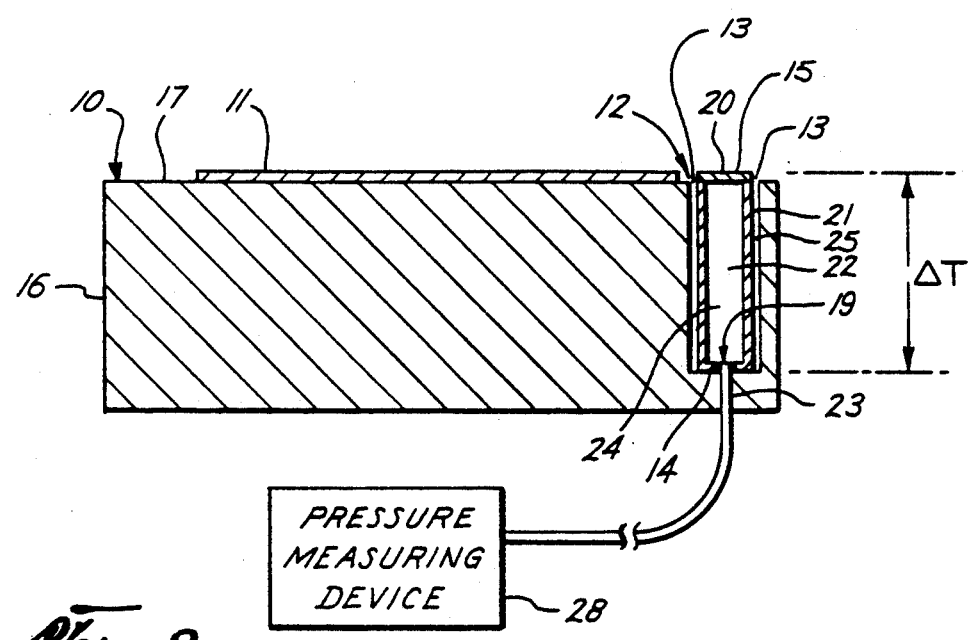
FIG. 2 is a cross-sectional view of the wafer chuck of FIG. 1 and also showing the cross-section of the fluxmeter of the present invention.

Referring to FIGS. 1 and 2, a wafer chuck 10 is shown which includes the fluxmeter 20 of the present invention. The actual design of wafer chuck 10 can be from a variety of prior art chuck or platen designs used for supporting a semiconductor wafer 11 thereon. As shown in FIG. 1, chuck 10 is comprised of a substantially solid body 16, which is typically fabricated from a metallic substance, such as aluminum or stainless steel. The semiconductor wafer 11 resides upon the upper surface 17 of chuck 10. In most instances, chuck 10 is circular in shape to conform to the shape of the semiconductor wafer 11, however, the actual shape and size of the chuck 10 is a design choice and not pertinent to the practice of the present invention.

A hole 12 is cut or bored into chuck 11 in order to house the fluxmeter 20. Although a circular opening is shown in FIGS. 1 and 2, it is to be appreciated that the actual shape of the opening will conform to the shape of the fluxmeter 20. As is shown in the drawings, hole 12 is circular in shape and having a predetermined depth, in order to accommodate a cylindrically shaped fluxmeter 20. Although the actual location of fluxmeter 20 within chuck 10 relative to wafer 11 is a design choice, typically the wafer 11 is disposed centrally upon surface 17 of chuck 10 and hole 12 resides adjacent to wafer 11. Thus, it is desirable to have chuck 10 sufficiently accommodate wafer 11 and fluxmeter 20 upon its upper surface 17. Furthermore, it is desirable to have the sidewall 16 of chuck 10 be at a sufficient depth in order to accommodate fluxmeter 20, such that the bottom 14 of the fluxmeter 20 rests upon and is supported by chuck 10.

Fluxmeter 20 of the preferred embodiment is a cylindrically shaped hollow gas bulb 24 having a body 21 confining an inner cavity 22. However, cavity 22 has an opening 19 at one end wherein tubing 23 provides for a passage externally to a pressure measuring device 28. One significant advantage of the fluxmeter 20 of the present invention is that it provides a non-electrical instrument for the measurement of energy flux. Hence, it will not be appreciably affected by the presence of strong RF fields which are often used in plasma systems. The tubing 23 may include a non-conducting section, such as a glass capillary, for electrical isolation of the bulb 24 and the chuck 10.

In the placement of fluxmeter 20 within opening 12, only the bottom surface 14 of fluxmeter 20 makes physical contact with chuck 10. Along the sidewall of opening 12, gap 13 separates the body 21 from chuck 10. The upper surface 15 of fluxmeter 20 is approximately at the same level as the upper surface of wafer 11.

Prior to utilization, cavity 22 is filled with an inert gas, such as helium, and this gas is coupled to the pressure measuring device 28 by tubing 23. Device 28 measures the gas pressure of the inert gas in cavity 22. It is to be noted that other gases such as nitrogen or chlorine, can be readily used also.

In operation, chuck 10, which includes fluxmeter 20, is placed in a reactor chamber during plasma processing. Because the upper end of the fluxmeter 20 is situated proximal to the wafer and constitutes a well defined area which is exposed to the plasma energy flux, the plasma flux (heat per unit area) which impinges on wafer 11, also impinges on the upper surface of fluxmeter 20. Accordingly, the amount of flux coupled onto the upper surface 17 of chuck 10 is substantially equivalent to the flux on the upper surface 15 of the fluxmeter 20.

The chuck 10 basically functions as a heat sink for the wafer and the energy flux impinging onto it. The chuck 10 also functions as a heat sink for fluxmeter 20.

Figure 5:
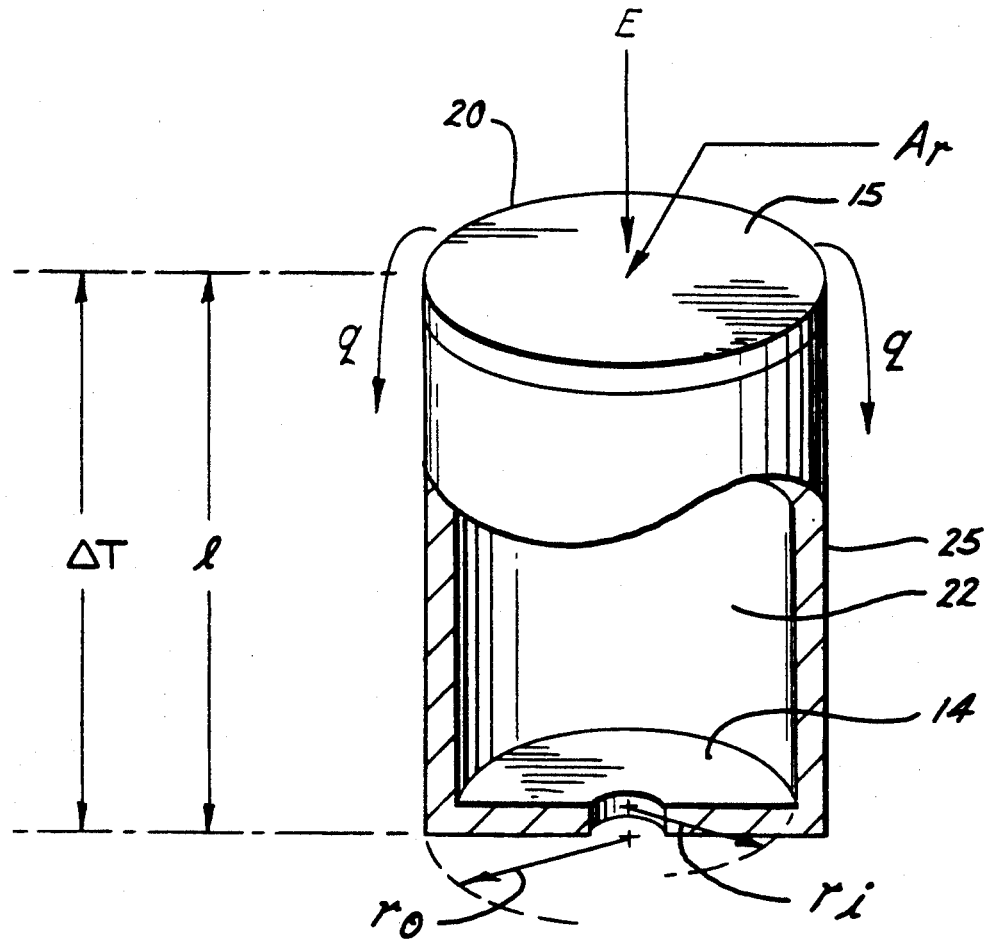
FIG. 5 is an illustration of the fluxmeter of the present invention showing the various dimensional parameters of the pneumatic bulb.

The energy impinging on the exposed surface 15 of the bulb 24 is converted to heat, which flows down the wall 25 of the gas bulb 24 to the heat sink 10 at the base 14. This heat flow is expressed as $$q = k \frac{a_{wall}}{l} \Delta T \qquad \text{(Equation 1)}$$

where q is the heat flow, k is the thermal conductivity of the bulb material, 1 is the length of the bulb wall, $\Delta T$ is the temperature difference between the exposed end 15 and the base 14 of the bulb 24. The cross-sectional area of the bulb wall 25 is given by $$a_{wall} = \pi(r_o^2 - r_i^2) \qquad \text{(Equation 2)}$$

where $r_o$ is the radius of the outer wall and $r_i$ is the radius of the inside of the bulb. The parameters are better illustrated in FIG. 5.

Since the bulb 24, connecting tubing 23 and pressure sensor 28 comprise a closed system, the quantity of gas in this closed system will remain constant and to the first order the volume of the bulb will also be constant. (A correction can be computed for thermal expansion of the bulb, however, it can also be calibrated into the system constant.) The average temperature of the bulb 24, and hence the gas in the bulb 24 will be $$T_{avg} = T_{chuck} + \frac{\Delta T}{2} \qquad \text{(Equation 3)}$$

At zero power input into the flux meter, $\Delta T = 0$, and $T_{avg} = T_{chuck}$. This will be the condition in which the system is filled with gas, thus the number of mols of gas in the bulb 24 will be $$n = \frac{P_o V}{RT} \qquad \text{(Equation 4)}$$

where $P_o$ is the filling pressure, V is the volume of the system, R is the gas constant, and T is the temperature at the filling pressure. The system will be designed such that the volume of the bulb 24 will be the predominant volume in the system, thus to a first approximation, V and T in Equation 4 will refer to the bulb volume and the chuck temperature.

When power is applied, the temperature will increase and because the quantity of gas is constant the pressure will also increase $$n = \frac{P_1 V}{RT_{avg}} \qquad \text{(Equation 5)}$$

and the difference in the quantity of gas in the two states will be zero $$\Delta n = \frac{P_1 V}{RT_{avg}} - \frac{P_0 V}{RT_{chuck}} = 0 \qquad \text{(Equation 6)}$$

Substituting Equation 3 for $T_{avg}$ and solving for $\Delta T$ $$\Delta T = 2 \frac{T_{chuck}(P_1 - P_0)}{P_0} \qquad \text{(Equation 7)}$$

Substituting this expression for $\Delta T$ into Equation 1, an expression for heat flux versus $\Delta P$ is derived as $$q = 2 \frac{kA_{wall} T_{chuck} \Delta P}{P_0 l} \qquad \text{(Equation 8)}$$

Combining the various constants and constant parameters into a single constant, the heat flux can be expressed as q linear function of $\Delta P$ $$a = K_0 T_{chuck} \Delta P \qquad \text{(Equation 9)}$$

where $K_0$ is the constant. This is the operating equation of the present invention.

Accordingly, as plasma energy flux impinge on fluxmeter 20, the temperature of the upper end 15 and wall 25 changes causing the temperature of the gas enclosed in cavity 22 to also change correspondingly according to the equations above.

Thus, the fluxmeter 20, provides for a pneumatic measurement technique to accurately determine the energy flux coupled to wafer 11.

As can be noted from the above description, fluxmeter 20 is actually a gas thermometer bulb which is attached at one end to the wafer chuck 10 well in the chuck body. At this point of attachment, a tube 23 extends out from the bulb. The purpose of the bulb 24 is to pneumatically measure the difference in temperature between the two ends 14 and 15 of the bulb 24.

It is appreciated that fluxmeter 20 can be designed to provide a certain pressure reading for a given energy flux encountered at the upper surface of fluxmeter 20. For example, adjusting the wall thickness 21 adjusts the thermal conductivity from the top 15 to the bottom 14 of fluxmeter 20. Thus, for low energy plasma conditions, it is preferable to use materials having poor conductivity, such as stainless steel. Because materials having poor conductivity allow less heat to flow down the bulb walls 25, a larger $\Delta T$ is obtained even at low plasma energy levels. For high plasma energy conditions it is preferable to use materials having good heat conductivity, such as copper or aluminum. The wall 25 is heated less because the higher thermal conductivity of these materials allows a greater flow of heat to the heat sink at the base, but with a $\Delta T$ sufficient to maintain an accurate measurement of the plasma energy coupled onto the upper surface 15 of fluxmeter 20.

Accordingly, parameters of the fluxmeter 20 can be varied by selecting material for the body 21 (specifically the sidewalls 25) of the fluxmeter 20, adjusting the length and thickness of the sidewalls, selecting the bulb size (cavity size) and selecting the pressure of the gas within cavity 22 to provide a corresponding change in pressure when certain plasma flux is encountered at the upper surface 15 of the fluxmeter 20.

For example, in one particular prototype design, the upper surface of the fluxmeter 20 was designed to have a 1 cm$^2$ area and a length of 2 cm for the sidewalls 21 in order to have a gas volume of 2 cm$^3$. The wall thickness of the bulb was designed a 0.254 mm (0.010 inches). For energy inputs of approximately 0.2 and 1.0 watt/cm$^2$, $\Delta T$'s were determined. The material selected was aluminum, and the base of the chuck was at a temperature of 125° K.

Thus, the average temperature ($T_{ave}$) can be calculated as $$T_{ave} = T_{chuck} + \Delta T/2 \qquad \text{(Equation 10)}$$

Figure 3:
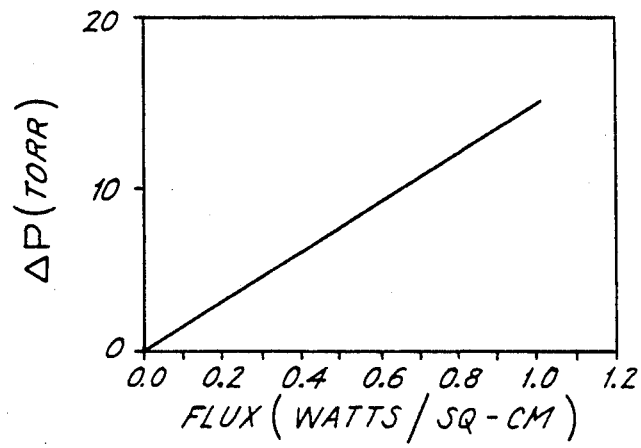
FIG. 3 is an alternate embodiment of the present invention in which a dual gas bulb arrangement fluxmeter is used.

The sensitivity or change in pressure per unit of energy flux when calculated results in a linear change as is shown in the graph of FIG. 3. FIG. 3 shows the change in pressure $\Delta P$ (torr) vs. flux (watts/cm$^2$). Because of the linear relationship, $\Delta P$ provides a reading which linearly corresponds to the actual energy flux.

Figure 4:
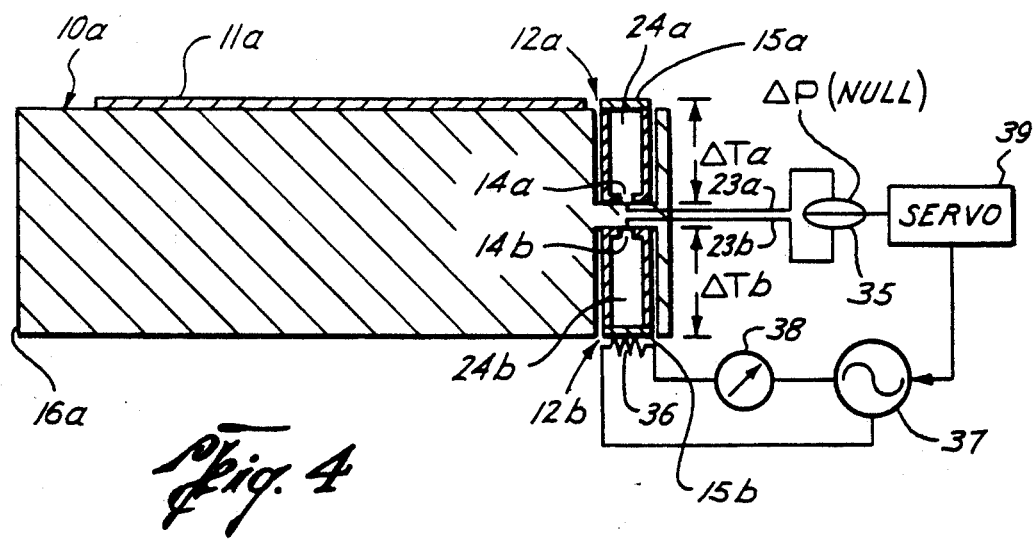
FIG. 4 is a graphical illustration showing the change in pressure in the gas bulb of the fluxmeter due to a change in energy flux for a gas.

Referring to FIG. 4, an alternative embodiment of the present invention is shown. Instead of utilizing a single bulb 24 as is shown in FIGS. 1 and 2, the alternative embodiment utilizes two separate bulbs 24a and 24b. Instead of a single opening 12, wafer 10a of the alternative embodiment has two opposing openings 12a and 12b at opposite surfaces of chuck 10a. The first bulb 24a, is inserted into the first opening 12a equivalently to the bulb 24 of FIG. 2. The second bulb 24b is inserted into opening 12b, also equivalently to that of bulb 24 of FIG. 2 but upside down. Thus, one bulb 24a is exposed to and heated by the plasma as bulb 24, but the second bulb 24b is hidden from the plasma due to its opening 12b to the underside surface of chuck 10a. As is shown in FIG. 4, the two bulbs 24a and 24b have their base contact surfaces 14a and 14b proximal to each other at the interior portion of chuck 10a.

The gas passage 23a of bulb 24a is coupled to one side of a differential pressure sensing device 35, while the passage 23b of the second bulb 24b is coupled to the other side of the pressure sensing device 35.

A heating element 36 is coupled to the exposed surface of the second bulb 24b. This heating element 36 is powered by a power supply 37. A meter 38 (or some other current measuring device) for measuring the current to the heater 38 is coupled in the circuit. Further, a control mechanism 39 such as a servo, is coupled to the pressure device 35 and power supply 37.

When the bulbs 24a and 24b are filled with gas at zero power input, both are connected together and are thus filled to the same pressure with zero power input from the plasma on bulb 24a and the heater on the compensating bulb 24b. After filling the gas lines 23a and 23b, they are connected in opposition across the differential pressure device 35 and no differential pressure will be present if $\Delta Ta = \Delta Tb$.

Once the plasma is turned on, the upper surface of bulb 24 will increase in temperature such that $\Delta Ta$ will no longer equal $\Delta Tb$, causing a difference in the differential pressure between the two bulbs 24a and 24b, which is sensed by device 35. Because device 35 is coupled to servo 39, servo mechanism 39 is activated to provide a feedback to drive power supply 37 to compensate for this difference in the differential pressure. The feedback causes the power supply to provide additional power to heater 36, which then causes the exposed surface 15b of bulb 24b to increase in temperature. However, when heater element 36 causes surface 15b to be at the same temperature as surface 15a, $\Delta Tb$ will then equal $\Delta Ta$, causing the differential pressure of device 35 to again be at zero (null position).

Thus, when the differential pressure is balanced, the heat flux generated electrically to bulb 24b will equal the heat from the plasma on the first bulb 24a. By measuring the heater current by meter 38 and using a suitable $i^2R$ conversion, the electrical input into the second bulb 24b can be calculated and will be approximately equivalent to the plasma energy impinging onto the first bulb 24a and this heat energy can be measured in electrical terms. Thus, the alternative embodiment provides for a continually electrically calibrated system for measuring the amount of energy flux which impinges on the upper surface of the wafer 11a. The energy flux is thereby directly measurable in terms of electrical units (i.e., watts).

Thus, a single bulb fluxmeter and a dual bulb fluxmeter are described.

I claim:

1. An apparatus for use in measuring plasma energy flux impinging upon a specimen disposed proximally adjacent to said apparatus comprising:
    a first housing having an exposed surface and an enclosed wall of predetermined length and thickness with a first hollow cavity disposed therein for holding a first predetermined volume of gas in said first cavity;
    said exposed surface of said first housing having a predetermined area exposed to have plasma energy impinge thereon, wherein plasma energy flux is defined by said plasma energy impinging on per unit area of said exposed surface;
    said enclosed wall of said first housing being formed from a heat conductive material such that a rate of heat conductivity is determined by said length, thickness and material of said enclosed wall and wherein said enclosed wall is disposed so as not to have plasma energy impinge thereon;
    said first housing having a base disposed opposite to its exposed surface and separated by said enclosed wall, wherein said base for having a substantially constant temperature;
    a second housing having an exposed surface, base and an enclosed wall of predetermined length, thickness and material equivalent to that of said first housing with a second hollow cavity disposed therein for holding a second predetermined volume of said gas in said second cavity, said second housing being sheltered from said impinging plasma energy, but having its base disposed opposite to its exposed surface, such that said bases of said first and second housings are proximal to each other and have substantially the same constant temperature;
    a differential pressure sensor coupled differentially to said first and second cavities for sensing gas pressure difference between said first and second cavities;
    a heater coupled to said exposed surface of said second housing and to said differential pressure sensor for heating said exposed surface of said second housing;
    said plasma energy impinging on said exposed surface of said first housing causes a temperature difference in said first housing between its exposed surface and its base which causes said gas in said first cavity to be heated, wherein a value of said energy flux is determined by said temperature difference and heat conductivity and sensed by a pressure change of said gas in said first cavity;
    said differential pressure sensor senses the difference in gas pressure between said first and second cavities and adjusts heater current, to said heater until gas pressure of said first and second cavities are equal, said second housing operating equivalently to said first housing such that measuring said heater current at equilibrium determines the amount of heat energy coupled to said exposed surface of said second housing which simulates the amount of energy flux impinging on said exposed surface of said first housing.

2. The apparatus of claim 1 further including a power source coupled between said heater and said differential pressure sensor for providing said heater current to said heater, said power source being coupled to and controlled by said differential pressure sensor.

3. The apparatus of claim 2 further including a current sensor coupled to said heater and said power source for measuring said heater current.

4. The apparatus of claim 3 wherein said first and second housings are fabricated from aluminum.

5. The apparatus of claim 3 wherein said first and second housings are fabricated from stainless steel.

6. In a semiconductor wafer chuck which is used to support a semiconductor wafer during plasma processing, an apparatus for use in measuring plasma energy flux impinging upon said semiconductor wafer during processing of said semiconductor wafer comprising:
    a first housing having an exposed surface and an enclosed wall of predetermined length and thickness with a first hollow cavity disposed therein for holding a first predetermined volume of gas in said first cavity;
    said second surface of said first housing having a predetermined area exposed to have plasma energy impinge thereon wherein plasma energy flux is defined by said plasma energy impinging on per unit area of said exposed surface;
    said enclosed wall of said first housing being formed from a heat conductive material such that a rate of heat conductivity is determined by said length, thickness and material of said enclosed wall and wherein said enclosed wall is disposed so as not to have plasma energy impinge thereon;
    said first housing having a base disposed opposite to its exposed surface and separated by said enclosed wall, wherein said base for having a substantially constant temperature;
    a second housing having an exposed surface, base and an enclosed wall of predetermined length, thickness and material equivalent to that of said first housing with a second hollow cavity disposed therein for holding a second predetermined volume of said gas in said second cavity, said second housing being sheltered from said impinging plasma energy, but having its base disposed opposite to its exposed surface, such that said bases of said first and second housings are coupled to said wafer chuck and are proximal to each other and have substantially the same constant temperature;

a differential pressure sensor coupled differentially to said first and second cavities for sensing gas pressure difference between said first and second cavities;

control means coupled to said differential pressure sensor for providing a control signal as a response to the differential pressure between said two cavities;

a heater coupled to said exposed surface of said second housing and to said control means for heating said exposed surface of said second housing in response to said control signal from said control means;

said plasma energy impinging on said exposed surface of said first housing causes a temperature difference in said first housing between its exposed surface and its base which causes said gas in said first cavity to be heated, wherein a value of said energy flux is determined by said temperature difference and heat conductivity and sensed by a pressure change of said gas in said first cavity;

said differential pressure sensor senses the difference in gas pressure between said first and second cavities and said control means adjusts heater current to said heater until gas pressure of said first and second cavities are equal, said second housing operating equivalently to said first housing such that measuring said heater current at equilibrium determines the amount of heat energy coupled to said exposed surface of said second housing which simulates the amount of plasma energy flux impinging on said exposed surface of said first housing and determines said plasma energy flux impinging on said semiconductor wafer.

7. The apparatus of claim 6 further including a power source coupled to said heater for providing power to said heater and a current sensor coupled to said heater for measuring said heater current.

8. The apparatus of claim 7 wherein said power source is also coupled to said control means for receiving said control signal to control said heater current.

9. The apparatus of claim 6 wherein said first and second housings are fabricated from aluminum.

10. The apparatus of claim 6 wherein said first and second housings are fabricated from stainless steel.

* * * * *

UNITED STATES PATENT AND TRADEMARK OFFICE
CERTIFICATE OF CORRECTION

PATENT NO. : 5,159,264

DATED : October 27, 1992

INVENTOR(S) : Richard L. Anderson

It is certified that error appears in the above-identified patent and that said Letters Patent is hereby corrected as shown below:

Column 2, line 40, insert --is-- between "difference" and "then".

Column 5, Equation 8, the denominator "$P_o1$" should be --$P_o 1$--.

Column 5, line 28, "as q" should be --as a--.

Column 5, Equation 9, the variable "a" to the left of the "=" sign should be --q--.

Column 6, line 11, "a" should be --at--.

Column 8, line 44, "second" should be --exposed--.

Signed and Sealed this

Twenty-eighth Day of June, 1994

BRUCE LEHMAN

Attest:

Attesting Officer

Commissioner of Patents and Trademarks